(12) United States Patent
Demenitroux et al.

(10) Patent No.: US 11,705,868 B2
(45) Date of Patent: Jul. 18, 2023

(54) SYSTEM FOR ADAPTING THE VOLTAGE OF A DRAIN OF A POWER STAGE

(71) Applicant: THALES, Courbevoie (FR)

(72) Inventors: Wilfried Demenitroux, Cholet (FR); Nicolas Berthou, Genevilliers (FR); Olivier Jardel, Toulouse (FR)

(73) Assignee: THALES, Courbevoie (FR)

( * ) Notice: Subject to any disclaimer, the term of this patent is extended or adjusted under 35 U.S.C. 154(b) by 17 days.

(21) Appl. No.: 17/558,220

(22) Filed: Dec. 21, 2021

(65) Prior Publication Data

US 2022/0200536 A1    Jun. 23, 2022

(30) Foreign Application Priority Data

Dec. 22, 2020    (FR) ...................................... 2013971

(51) Int. Cl.
*H03F 1/02*    (2006.01)
*H03F 3/24*    (2006.01)
*H04B 1/04*    (2006.01)

(52) U.S. Cl.
CPC ........... *H03F 1/0233* (2013.01); *H03F 3/245* (2013.01); *H04B 1/04* (2013.01); *H03F 2200/451* (2013.01); *H04B 2001/0416* (2013.01)

(58) Field of Classification Search
CPC .. H03F 1/0233; H03F 3/245; H03F 2200/451; H04B 2001/0416; H04B 1/04
See application file for complete search history.

(56) References Cited

U.S. PATENT DOCUMENTS 4,547,746 A    10/1985  Erickson et al.
7,103,114 B1    9/2006  Lapierre
(Continued)

FOREIGN PATENT DOCUMENTS

EP    2 709 275 A1    3/2014

*Primary Examiner* — David S Huang
(74) *Attorney, Agent, or Firm* — BakerHostetler

(57) ABSTRACT

A system for adapting the voltage of a drain of a power stage includes at least two transmission paths $T_{Xa}$, a transmission path comprising a resistive element ($1_n$), a phase control module ($2_n$), and a power stage ($3_n$) at the output of which a radiating element ($E_n$) is arranged, comprising at least: a device ($5_n$) for determining the value of a reflected power $P_r$, the value of an incident power $P_i$ in a power stage, and the ratio of the powers R, an analogue device ($6_n$) configured so as to pulse width-modulate the difference signal, a switching cell ($7_n$) receiving a low-power PWM signal and designed to generate a power signal $PWM_a$ that is transformed, by a low-pass filter ($8_n$), into a bias signal for biasing the power stage in accordance with a predefined bias control law.

5 Claims, 3 Drawing Sheets

(56) References Cited

U.S. PATENT DOCUMENTS

| | | |
|---|---|---|
| 10,038,441 B2 | 7/2018 | Jardel et al. |
| 2003/0087626 A1* | 5/2003 | Prikhodko .............. H03F 1/302 |
| | | 455/341 |
| 2011/0148519 A1* | 6/2011 | Drogi ................... H03G 3/3042 |
| | | 330/129 |
| 2018/0342991 A1 | 11/2018 | McCune, Jr. et al. |
| 2020/0007092 A1* | 1/2020 | Wang ........................ H03F 3/19 |

* cited by examiner

SYSTEM FOR ADAPTING THE VOLTAGE OF A DRAIN OF A POWER STAGE

CROSS-REFERENCE TO RELATED APPLICATIONS

This application claims priority to foreign French patent application No. FR 2013971, filed on Dec. 22, 2020, the disclosure of which is incorporated by reference in its entirety.

FIELD OF THE INVENTION

The invention relates to a system for adapting the voltage of a drain of a power stage. It is applicable notably for managing the bias voltage of power amplifiers positioned for example in an active antenna device in order to avoid damaging them.

BACKGROUND

It is applied in all types of communication means using active antennas, for example microwave transmission, various-generation cellular networks (5G) and more generally any high-frequency F communication means, where F is greater than a few hundred megahertz.

The active antenna principle illustrated in FIG. 1 is based on an antenna array comprising N transmission paths $T_{Xi}$, where i=1, . . . , N. A transmission path $Tx_1$ comprises a resistive element $1_1$, a phase control module $2_1$, and a power transistor $3_1$ at the output of which a radiating element $E_1$ or active element of the antenna is arranged. Each active element $E_1$ is phase-controlled and amplitude-controlled in order to form the beams. The active elements (radiating elements) are positioned very close to one another. The mutual impedance applied to all of the radiating elements may lead to some of them becoming mismatched, possibly leading to premature ageing thereof, or even to destruction of their power amplifier.

Another solution consists in placing isolators $4_1$ (FIG. 1) at the output of a power transistor $3_1$ in order to protect the power chains. Isolators (based on ferrite components) are bulky, voluminous, expensive and exhibit non-negligible insertion losses. They are therefore unsuitable for active antennas, in particular when these have a large number of radiating elements and are arranged in small volumes.

The solutions offered by the prior art exhibit various drawbacks, the overdimensioning of the transistors that are used, which means worse efficiency, the requirement to add isolator elements, thereby generating an increase in mass, and a higher bulk and cost for the antenna system.

The premature ageing of the power transistors may additionally require preventative replacement thereof, when this option is possible.

SUMMARY OF THE INVENTION

The invention notably offers a solution for solving at least one or more of the problems of the prior art. It proposes a structure that makes it possible to respond very quickly in terms of adapting the drain voltage of a power stage in order to protect the power stage subject to significant mismatching.

The invention relates to a system for adapting the voltage of a drain of a power stage comprising at least two transmission paths $T_{Xi}$, a transmission path comprising a resistive element, a phase control module, and a power stage at the output of which a radiating element is arranged, characterized in that it comprises at least:

A device for determining the value of a reflected power $P_r$, the value of an incident power $P_i$ in a power stage, and the ratio of the powers R, A modulation device configured so as to pulse width-modulate said difference signal, A switching cell receiving a low-power PWM signal and designed to generate a power signal $PWM_a$ that is transformed, by a low-pass filter, into a bias signal for biasing the power stage in accordance with a predefined bias control law.

The device for determining the power values is for example a coupler configured so as to tap off the voltages Vr and Vi that are images of the incident power Pi and of the reflected power Pr.

The analogue device comprises for example a plurality of logarithmic amplifiers, a subtractor designed to generate, at output, a voltage "$V_{ra}$" that is an image of the ratio RC of the incident power $P_i$ and of the reflected power $P_r$, and an analogue device configured so as to pulse width-modulate PWM the voltage $V_{ra}$.

The power stage is for example a power transistor and the antenna element is located at the output of the power transistor.

The antenna elements may be configured so as to operate in frequency bands greater than 800 MHz.

The antenna elements may be configured so as to operate in 4G/5G networks.

BRIEF DESCRIPTION OF THE DRAWINGS

Other features, details and advantages of the invention will become apparent from reading the description, which is given with reference to the appended drawings, which are given by way of illustrative and non-limiting example and in which, respectively.

DETAILED DESCRIPTION

The following example is given by way of non-limiting illustration for an active antenna comprising a plurality of radiating elements. The idea is to integrate a switching cell directly into the power stage, for example a fast DC/DC converter that is capable of adapting the power bias (drain voltage in the case of an amplifier based on field-effect transistors) on the basis of the ratio between the reflected power $P_r$ and the incident power $P_i$ at the output of the amplifiers of each radiating element.

The coefficient of reflection RC is equal to the ratio $$\frac{Vr}{Vi}.$$

The return losses RL are equal to $-20 \log|RC|$ and the standing wave ratio VSWR is defined by $$VSWR = \frac{1 + 10^{-\left(\frac{RL}{20}\right)}}{1 - 10^{-\left(\frac{RL}{20}\right)}}.$$

It is possible to take into consideration the ratio $$R = \frac{Pr}{Pi},$$

therefore the ratio of the voltages $$\frac{Vr}{Vi}$$

retrieved after the coupler, will be described below.

Figure 2:
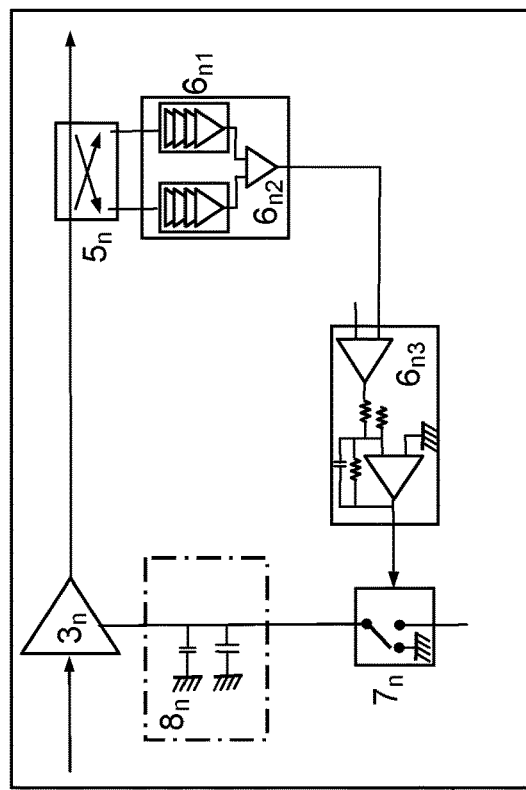
FIG. 2 is a diagram of one example of an architecture according to the invention.
Figure 2:
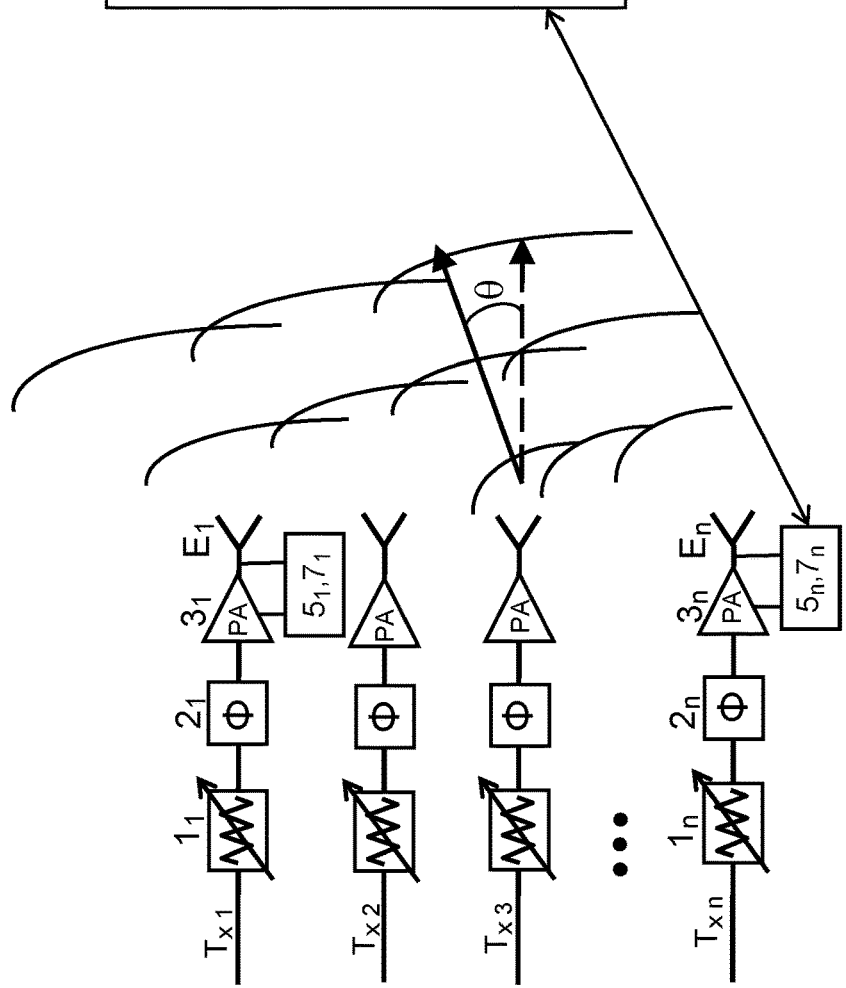

FIG. 2 is a diagram of one example of the system configured so as to adapt the voltage of a drain of a power stage, according to one exemplary embodiment of the invention.

Figure 1:
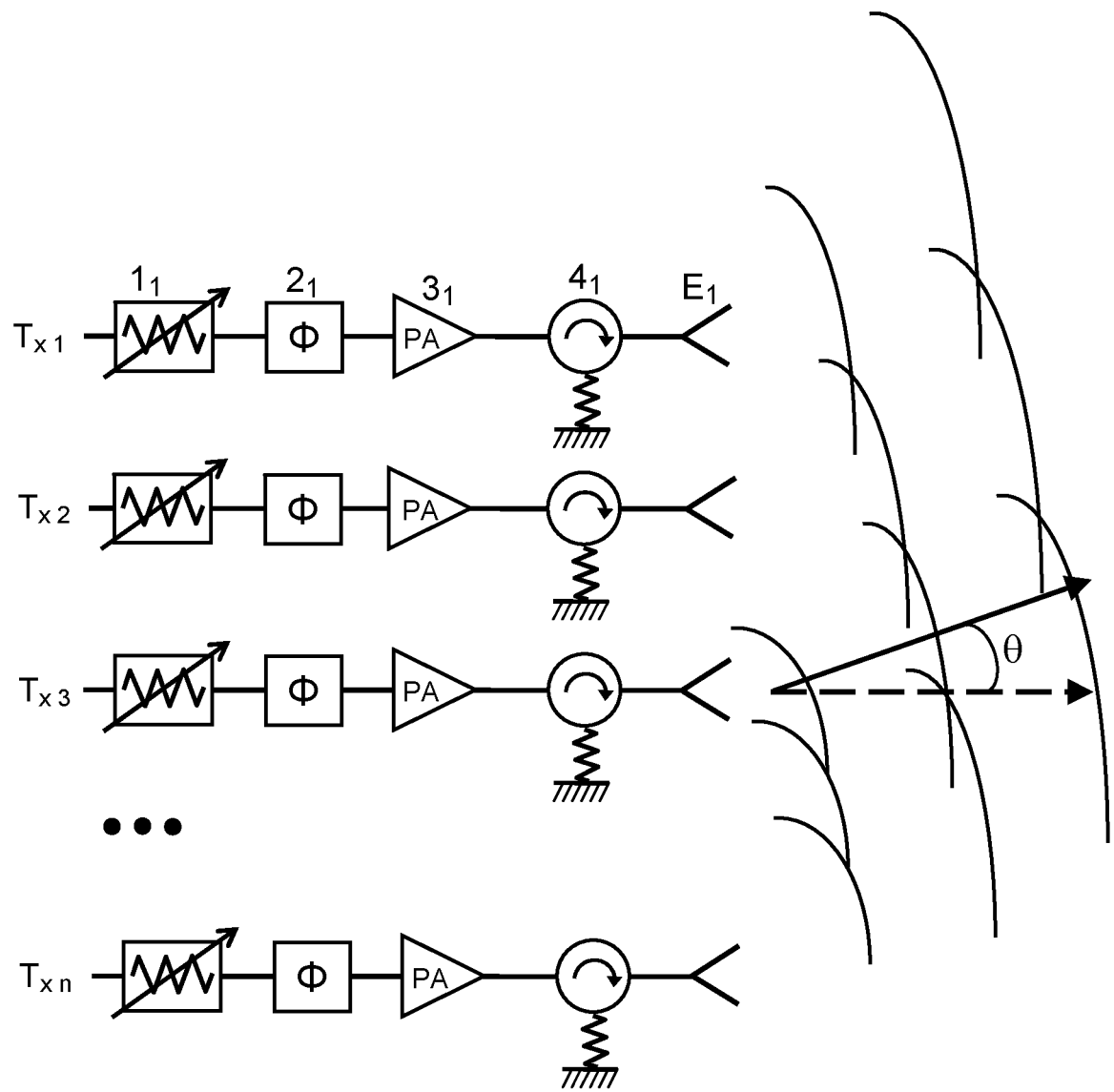
FIG. 1 is one example of an architecture according to the prior art.

The elements of FIG. 2 in common with those of FIG. 1 bear the same references. The index n is used to denote any transmission chain.

The system comprises a set of N radiating antenna elements (active elements) $E_1, \ldots E_n$.

A transmission chain $T_{xn}$ consists of a matching resistor $1_n$ positioned upstream of a phase adjustment device $2_n$;

At the output of the power transistor $3_n$ and before the input of the active element $E_n$, the transmission chain comprises a coupler $5_n$. The coupler $5_n$ notably has the role of tapping off the voltages $V_i$ and $V_r$, which are an image of the incident and reflected powers, respectively. An analogue modulation device $6_{n1}$ based on logarithmic amplifiers and a subtractor $6_{n2}$ makes it possible to generate, at the output thereof, a voltage "$V_{ra}$" that is an image with respect to the incident and reflected powers $P_i$ and $P_r$. Since this analogue device is known to those skilled in the art, it will not be described in detail.

An analogue device $6_{n3}$ is configured so as to pulse width-modulate PWM this voltage $V_{ra}$.

The generated PWM signal is transmitted to a variable-bias cell based on the fast-switching cell. It controls this bias cell and makes it possible to modulate the drain voltage $V_{ds}$ of the power amplifier.

The switching cell receives a (PWM) low-power square-wave signal and returns a (PWM) power square-wave signal. A low-pass filter at the output thereof (typically large capacitors) makes it possible to transform this square-wave signal into a DC signal, which is the bias signal and which is variable as a function of the widths of the pulses.

The bias voltage value of the drain will be determined on the basis of a pre-established law L=f(R) that defines the value of the bias of the power transistor as a function of the PWM signal.

The switching cell $7_n$ receives the PWM signal and returns the same signal $PWM_a$, but amplified by chopping. Passing this "power" signal into a low-pass filter $8_n$ gives a variable-power bias voltage $V_{pv}$. The low-pass filter may be formed by a network of capacitors normally placed on the bias access point of the amplifier.

Measuring values of powers and computing the ratio of the incident power and the reflected power makes it possible to change the bias value to a minimum value that is determined in advance in order to protect each amplifier that will be overloaded by the voltage standing wave ratio of the others.

Any parameter similar to the power ratio may also be used to implement the invention.

Figure 3:
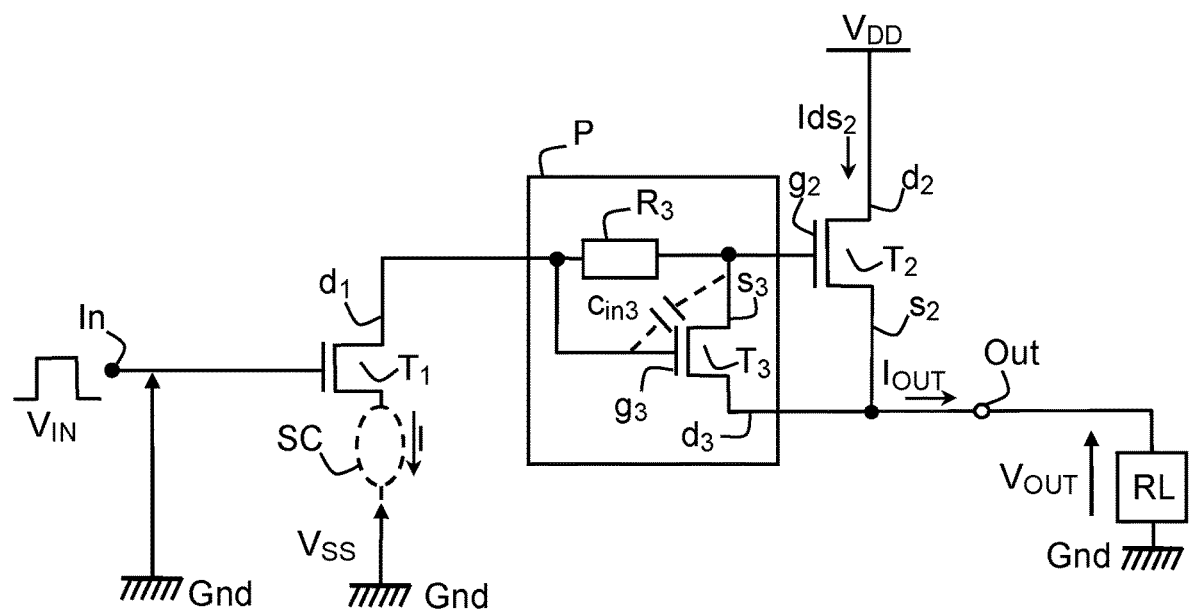
FIG. 3 is one example of a switching cell.

FIG. 3 illustrates the use of a switching cell as described in patent EP 3134972 from the Applicant. This cell consists of three normally on transistors (for example GaN RF HEMTs) arranged so as to amplify the voltage of an input signal (in this case the PWM signal), with a very high passband (the input signal may have a frequency of several tens of MHz), thus making the system very fast.

The current switch formed by the input transistor $T_1$ and the power transistor $T_2$ switches the high voltage $V_{dd}$.

The gate self-biasing circuit P comprises:

a transistor $T_3$ that is a normally on field-effect transistor, connected as follows: its drain $d_3$ is connected to the source $s_2$ of the power transistor $T_2$ and hence to the output pad Out of the cell; its source $s_3$ is connected to the gate $g_2$; its gate $g_3$ is connected to the resistor $R_3$, and a self-biasing resistor $R_3$ for biasing the gate $g_3$ of the transistor $T_3$, connected between this gate $g_3$ and the source $s_3$ of the transistor $T_3$, and in series with the drain of the first transistor $T_1$.

The resistor $R_1$ on the drain of the transistor $T_1$, present in the cell of the prior art, is not shown here. It is optional.

The assembly formed by the self-biasing circuit P and the power transistor $T_2$ constitutes the load of the input transistor $T_1$, which load is thus placed in series between the drain di of the transistor $T_1$ and the positive supply voltage $V_{dd}$.

In this structure, the transistor $T_3$ is like the transistor $T_2$; it is a floating-source transistor in the sense that its source $s_3$ is not referenced to a fixed potential: it follows the gate voltage of the power transistor $T_2$.

In the example, the current switch is formed from one transistor $T_1$; it could, without departing from the scope of the invention, comprise a plurality thereof, for example in order to form a differential pair.

The operation of a cell according to the invention will now be explained, considering a purely resistive output load, denoted Rl.

The cell has two stable states, the ON and OFF states:

the cell is said to be in the ON state when the transistors $T_2$ and $T_3$ are on (ON state), and the structure delivers power to the load, the cell is said to be in the OFF state when the transistors $T_2$ and $T_3$ are at the turn-off limit (OFF state), and the load is isolated from the main power supply.

The transistors $T_3$ and $T_2$ are switched to the ON or OFF state according to the control signal $V_{IN}$ applied as input In to the cell, and which controls the ON or OFF state of the transistor $T_1$.

The invention applies in the field of active antennas operating in frequency bands above 800 MHz, Satcom, 4G/5G networks, etc.

The system according to the invention notably has the following advantages:

The option of disconnecting the power supply to the amplification chain in order to protect it very quickly (a few ns), since the switching cell that is used is itself very fast, Being able to implement amplification modules without isolators in an active antenna, Dimensioning adapted to the amplification section, without the need to "overdimension" the power transistors.

The invention claimed is:

1. A system for adapting a voltage of a drain of a power stage, the system comprising:

at least two transmission paths $Tx_n$, a transmission path comprising a resistive element ($1_n$), a phase control module ($2_n$), and a power stage ($3_n$) at an output of which at least one radiating element ($E_n$) is arranged;

the system further comprising:

a device ($5_n$) configured to determine a value of a reflected power $P_r$, and a value of an incident power $P_i$ in the power stage, an analogue device ($6_n$) configured to generate a voltage that is an image of a power ratio of the incident power Pi and the reflected power Pr, and to pulse width-modulate said voltage that is an image of the power ratio, thereby providing a low-power signal PWM, a switching cell ($7_n$) configured to receive said low-power signal PWM and to generate a power signal $PWM_a$ by amplifying the low-power signal, a low-pass filter ($8_1$) configured to transform said power signal $PWM_a$ into a bias signal for biasing the power stage in accordance with a predefined bias control law.

2. The system according to claim 1, wherein the power stage is a power transistor and the system comprises a radiating antenna element located at an output of the power transistor, said radiating element being the radiating antenna element.

3. The system according to claim 1, wherein:
the device ($5_n$) is a coupler configured to tap off voltages $V_r$ and $V_i$ that are images of the incident power $P_i$ and of the reflected power $P_r$, the analogue device ($6_n$) comprises a plurality of logarithmic amplifiers ($6_{n1}$), a subtractor ($6_{n2}$) designed to generate, at output, said voltage that is an image of the power ratio, and an analogue modulation device ($6_{n3}$) configured to pulse width-modulate said voltage that is an image of the power ratio.

4. The system according to claim 1, wherein said at least one radiating element is configured to operate in frequency bands greater than 800 MHz.

5. The system according to claim 1, wherein said at least one radiating element is configured to operate in 4G/5G networks.

* * * * *